US007746683B2

(12) United States Patent
Hoffmann et al.

(10) Patent No.: US 7,746,683 B2
(45) Date of Patent: Jun. 29, 2010

(54) NOR AND NAND MEMORY ARRANGEMENT OF RESISTIVE MEMORY ELEMENTS

(75) Inventors: Kurt Hoffmann, Taufkirchen (DE); Christine Dehm, Nürnberg (DE); Recai Sezi, Roettenbach (DE); Andreas Walter, Dresden (DE)

(73) Assignee: Qimonda AG, Munich (DE)

(*) Notice: Subject to any disclaimer, the term of this patent is extended or adjusted under 35 U.S.C. 154(b) by 0 days.

(21) Appl. No.: 11/737,236

(22) Filed: Apr. 19, 2007

(65) Prior Publication Data

US 2007/0242496 A1 Oct. 18, 2007

Related U.S. Application Data

(63) Continuation of application No. PCT/EP2005/055279, filed on Oct. 14, 2005.

(30) Foreign Application Priority Data

Oct. 20, 2004 (DE) ....................... 10 2004 051 152

(51) Int. Cl.
*G11C 11/00* (2006.01)

(52) U.S. Cl. ....................... 365/148; 365/154; 365/158; 365/171; 365/167; 365/173

(58) Field of Classification Search ................. 365/148, 365/154, 158, 171, 167, 173
See application file for complete search history.

(56) References Cited

U.S. PATENT DOCUMENTS 6,314,014 B1 11/2001 Lowrey et al.
2003/0035314 A1 2/2003 Kozicki
2003/0147273 A1* 8/2003 Zhu et al. .................. 365/158
2004/0042298 A1* 3/2004 Hideki ....................... 365/202
2006/0067112 A1* 3/2006 Ferrant et al. ............... 365/158

FOREIGN PATENT DOCUMENTS

| EP | 1326254 A1 | 7/2003 |
|---|---|---|
| EP | 1426974 A2 | 6/2004 |
| EP | 1429342 A1 | 6/2004 |
| EP | 1455363 A1 | 9/2004 |
| WO | 98/33184 | 7/1998 |
| WO | 2004001760 A1 | 12/2003 |

* cited by examiner

*Primary Examiner*—Hoai V Ho
*Assistant Examiner*—Fernando N Hidalgo
(74) *Attorney, Agent, or Firm*—Edell, Shapiro & Finnan, LLC

(57) ABSTRACT

A memory arrangement includes: a first line for applying a reference voltage, a second line for applying an operating voltage, and a plurality of resistive memory elements, each element includes a resistive memory cell and a MOS memory cell selection transistor. A NOR memory arrangement is configured with each memory element including the resistive memory cell and selection transistor connected in series with the transistor connected to the first line, and the memory cell connected to the second line. A NAND memory arrangement is configured with a series of resistive memory elements forming a chain with each memory element including the resistive memory cell and selection transistor connected in parallel. The chain is connected to the first line disposed on a side of the memory cells facing the selection transistors and the second line disposed on a side of the memory cells which is remote from the selection transistors.

6 Claims, 10 Drawing Sheets

BL 9 7 6 1 3 8 n+ WL 5 4 10

WL
WL
WL
WL
BL
BL
6
10
1

BL
9
7
6
5
n+
WL
4
3
8
1
10

10
6
5
n+
WL
1
4
3
8
BL

BL
16
15
n+
SEL
6
13
1
9
12
8
WL
17
Poly2
14
3

Poly2
WL
SEL
BL
6
8
10
12,13
14
15
16
17
3

NOR AND NAND MEMORY ARRANGEMENT OF RESISTIVE MEMORY ELEMENTS

CROSS REFERENCE TO RELATED APPLICATIONS

This application is a continuation of International Application No. PCT/EP2005/055279, filed on Oct. 14, 2005, entitled "NOR and NAND Memory Arrangement of Resistive Memory Elements," which claims priority under 35 U.S.C. §119 to Application No. DE 102004051152.7 filed on Oct. 20, 2004, entitled "NOR and NAND Memory Arrangement of Resistive Memory Elements," the entire contents of which are hereby incorporated by reference.

BACKGROUND

Resistive memory materials can be used to construct memory cells in which one bit of information, i.e., a logic "1" or "0", is in each case represented by different electrical resistance values.

In recent years, phase change materials have been investigated, in particular, which can be brought to crystalline or amorphous phase states having different electrical resistances by heating. Typical phase change materials, such as those used in CDs and DVDs, are made of chalcogenides. Chalcogenides are distinguished in particular by the fact that their electrical resistance changes by several orders of magnitude if a change in the phase state between the amorphous phase and the crystalline phase is induced. A change in the phase state can be brought about via Joule heat, for example, by application of electric currents. By contrast, in polymer memory cells, the excitability of specific proteins, such as bacteriorhodopsin, embedded in a polymer layer is utilized for storing items of information, each alteration of the state of the proteins being accompanied by a different electrical resistance of the layer.

The current-voltage characteristic of such a polymer memory cell is shown, for example, in FIG. 1. In this case, the logic values "0" and "1" are represented by different electrical resistance values $R_{C0}$ and $R_{C1}$, respectively, of the memory cell. The two resistance values correspond to the high-resistance and the low-resistance straight line, respectively, in the current-voltage characteristic.

In the example of FIG. 1, a logic "0" is written by application of a voltage of +1V, wherein a logic "1" is written by application of a voltage of −1V. Writing to a resistive memory cell is also referred to as "programming" of the memory cell. If the state of the memory cell is intended to be read, a read voltage is applied whose value lies below the voltages for writing to the memory cell, in order to avoid an inadvertent reprogramming of the memory cell. In the present example, a read voltage of 0.5 V is applied and, in accordance with the different resistance values $R_{C0}$ and $R_{C1}$, a high and low current are respectively measured in order to detect the logic values "0" and "1".

A typical NOR architecture of a memory arrangement comprising a plurality of resistive memory cells is shown in FIGS. 2A, 2B and 2C. In this case, each resistive memory cell 1 is connected, on the one hand, via the source-drain path of a MOS memory cell selection transistor 2 to a bit line (BL). On the other hand, each resistive memory cell 1 is connected to a so-called cell plate or cell plate line 3 for applying a reference potential. The reference potential is applied as a reference point with respect to the potential of the bit line. Furthermore, each MOS memory cell selection transistor is connected via its gate terminal to a word line (WL) for the control thereof.

FIGS. 2A to 2C illustrate examples of writing and reading operation of a resistive memory cell in the NOR architecture. FIG. 2A schematically illustrates a first writing method. Accordingly, a fixed voltage of 1 V, for example, is present at the cell plate line 3, and different operating voltages of 0 V and 2 V, for example, are applied to the bit line for the purpose of switching the resistive memory cell 1 into the different states. In a second writing method, which is illustrated schematically in FIG. 2B, voltage is applied to the cell plate line 3 in a complementary manner with respect to the bit line, where in a case in which, for example, 0 V is applied to the bit line and, for example, 1 V is applied to the cell plate. Meanwhile, in a case wherein, for example, 1 V is applied to the bit line, for example, 0 V is applied to the cell plate. FIG. 2C illustrates the reading operation. Accordingly, the programmed state of a resistive memory cell 1 can be read via a reference voltage of 0 V, for example, being applied to the cell plate line 3, while a read voltage of 0.5 V, for example, is applied to the bit line.

In order to select the resistive memory cell 1 for writing or reading, the word line connected to the MOS memory cell selection transistor 2 of the selected memory cell 1 is put at 3 V, for example, during the reading or writing operation in order to put the associated MOS memory cell selection transistor 2 into its ON state, while the rest of the word lines are put at 0 V, for example, with the result that the associated MOS memory cell selection transistors 2 are in their OFF state.

FIGS. 3A and 3B schematically show a sectional illustration and plan view, respectively, associated with this typical NOR architecture of memory elements. Accordingly, for example, $n^+$-doped source regions 4 and likewise $n^+$-doped drain regions 5 are provided in the surface of a p-conducting semiconductor body. The drain regions 5 are in each case connected to the bottom electrodes 7 of resistive memory cells 1 via contact plugs 6 composed of polycrystalline silicon, for example. Consequently, a resistive memory material 9 is on the one hand connected to a drain region 5, while on the other hand it is connected to a cell plate line 3, which simultaneously acts as top electrode of the resistive memory cell 1. Respective word lines WL are arranged in a position disposed opposite channel zones (not specifically shown here) that are arranged between the source and drain regions and serve for controlling the MOS memory cell selection transistors. Furthermore, each source region 4 is connected to a bit line BL via contact plugs 8. As can be gathered from FIG. 3A, in particular, a source region 4 is in each case associated with a pair of drain regions 5, two adjacent pairs of drain regions 5 being insulated from one another by STI (Shallow Trench Isolation) trenches 10. Furthermore, the structures above the semiconductor plate are embedded in a dielectric material (not specifically illustrated) composed of $SiO_2$, for example. Only the bit line BL is illustrated in FIG. 3B, while the plate line (not illustrated) is to be imagined as running above the bit line. In FIG. 3B, the insulation clearance between contact plug and bit line is indicated by a dashed square around the contact plugs 6 connecting the MOS memory cell selection transistors to the memory cells.

In the conventional NOR architecture, the resistive memory cell 1 and the cell plate line 3 are arranged the furthest away from the surface of the semiconductor body having the source and drain regions. It is conventional or standard that the word and bit lines are led perpendicular to one another, which has the consequence of the bit lines having to be led parallel to the cell plate lines. However, a minimum circuit layout is not possible in this arrangement. Rather, the minimum area per memory cell (memory cell area) that can be achieved in the conventional NOR architecture is at best approximately 9 $F^2$, where F denotes the minimum feature size of the technology used for producing the circuit structures.

A further reduction of the minimum memory cell area that can be achieved is extremely desirable, primarily with regard to advancing miniaturization and an increase in performance of memory components.

SUMMARY

A memory arrangement is described herein including a first line to apply a reference voltage, a second line to apply an operating voltage, and a plurality of resistive memory elements, where each element includes a resistive memory cell and a MOS memory cell selection transistor. A NOR memory arrangement is configured with each memory element including the resistive memory cell and selection transistor connected in series with the transistor connected to the first line, and the resistive memory cell connected to the second line. A NAND memory arrangement is configured with a series of resistive memory elements forming a chain with each memory element including the resistive memory cell and selection transistor connected in parallel. The chain is connected to the first line, via a first terminal, disposed on a side of the resistive memory cells facing the MOS memory selection transistors and the second line, via a second terminal, disposed on a side of the resistive memory cells which is remote from the MOS memory selection transistors.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

Figure 1:
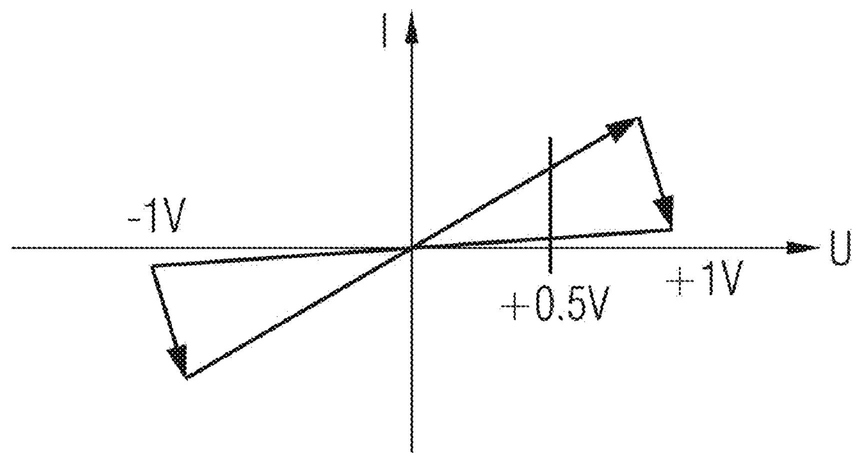
FIG. 1 schematically shows an example of the current-voltage characteristic of a polymer memory cell.
Figure 2A:
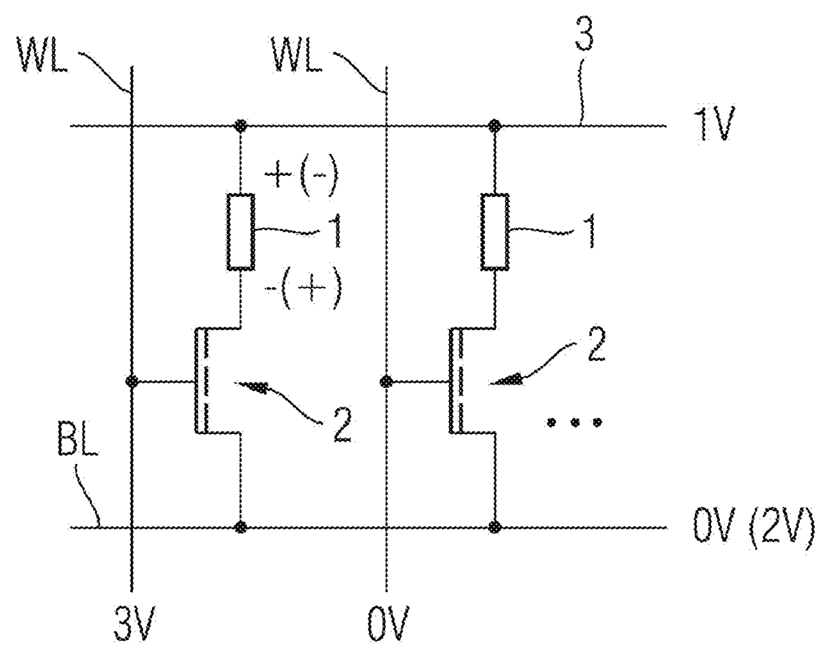
FIGS. 2A to 2C schematically illustrate a conventional NOR architecture comprising resistive memory cells, and also writing and reading operations.
Figure 2B:
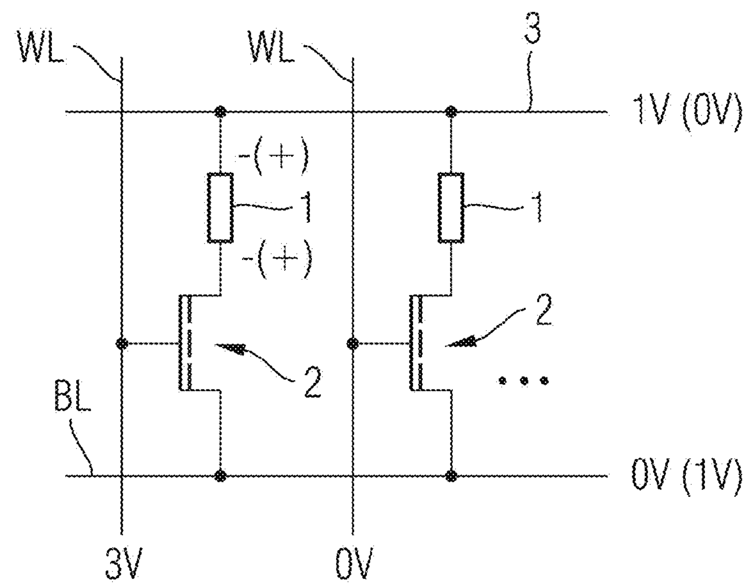
Figure 2C:
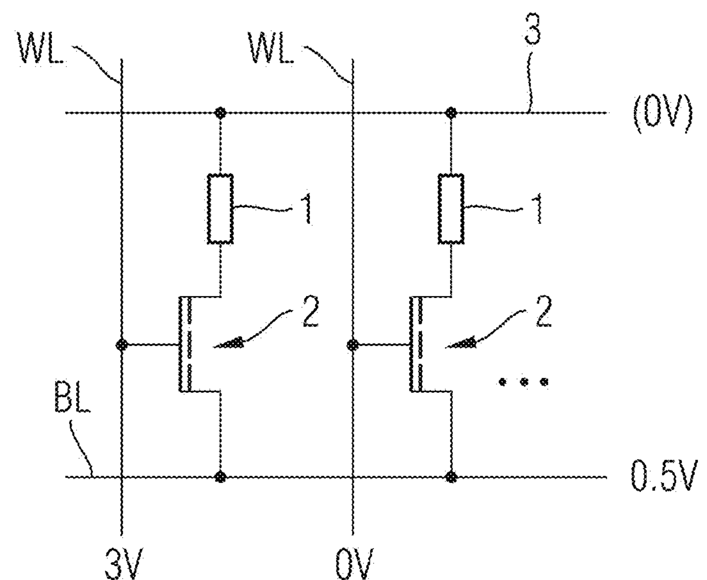
Figure 3A:
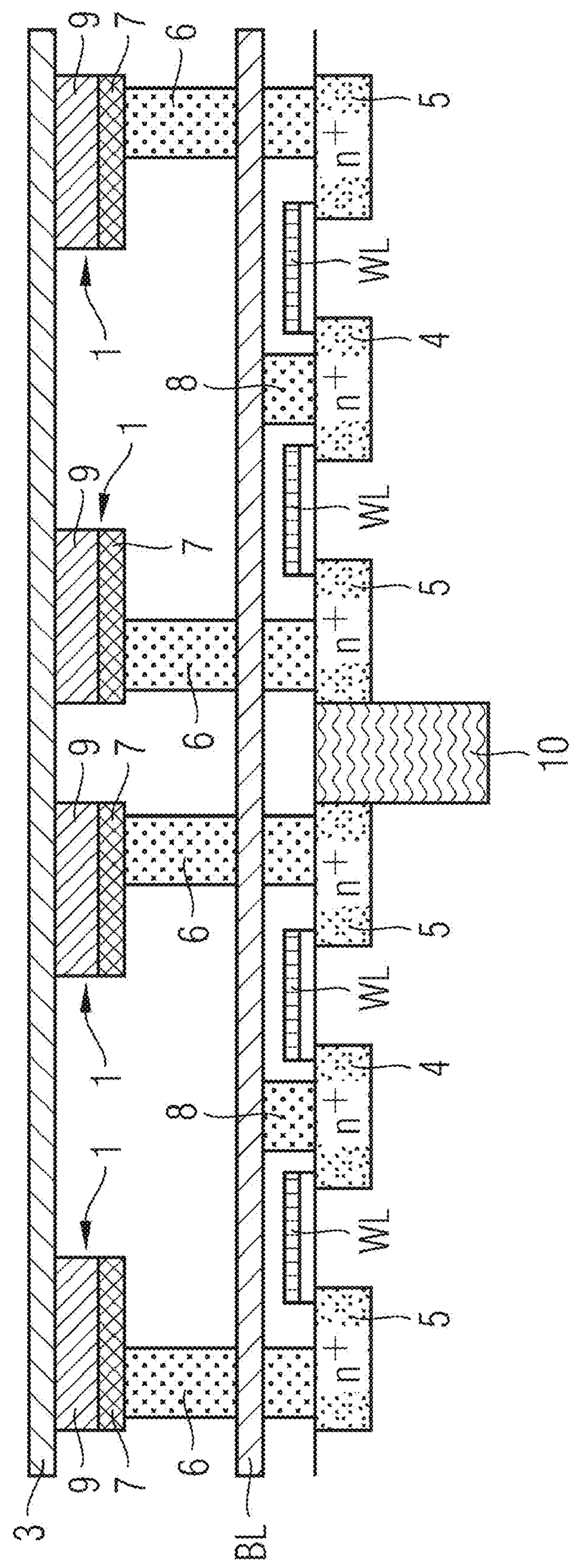
FIGS. 3A and 3B schematically show a sectional illustration and plan view of the conventional NOR architecture comprising resistive memory cells from FIGS. 2A to 2C.
Figure 3B:
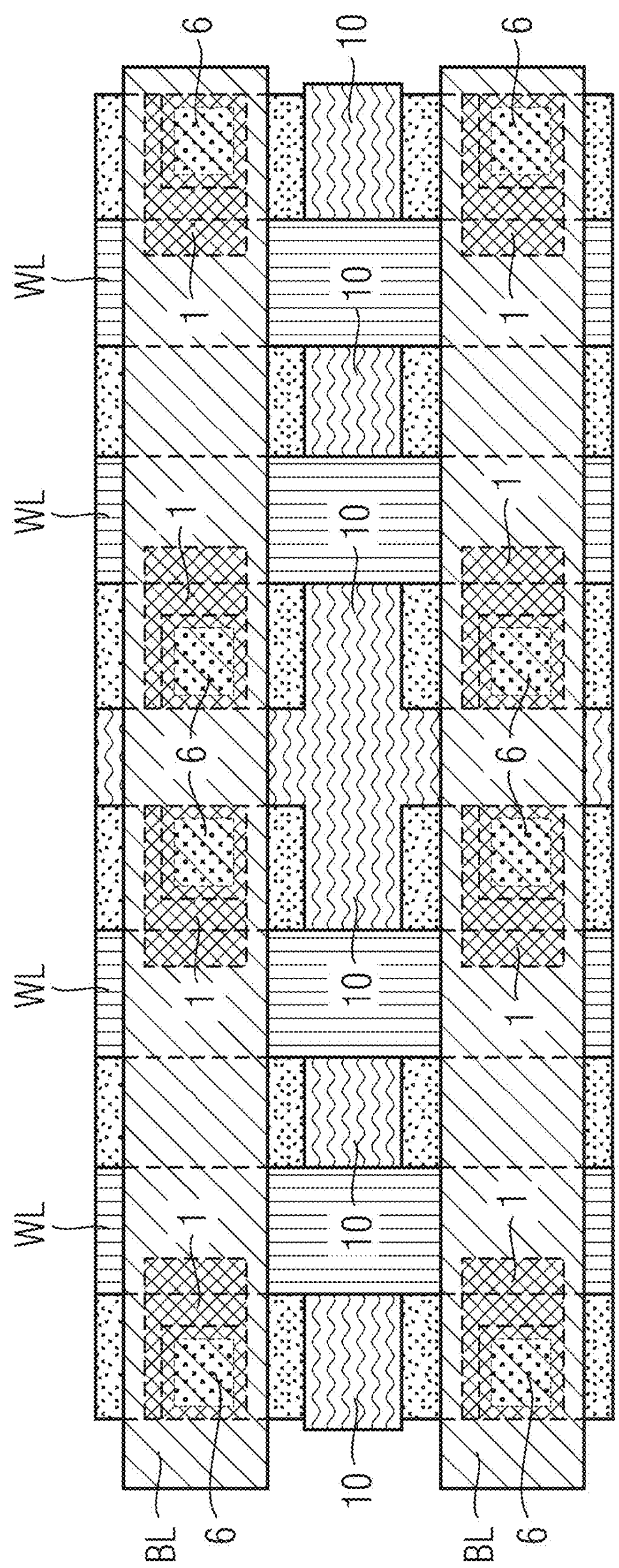

Memory arrangements described herein include a first embodiment configured as a NOR memory arrangement and a second embodiment configured as a NAND memory arrangement. These embodiments are described in detail below.

A NOR memory arrangement comprises a plurality or multiplicity of resistive memory elements which include a series circuit formed by a resistive memory cell and a MOS memory cell selection transistor. In other words, each resistive memory cell is connected in series with the source-drain path of the MOS memory cell selection transistor. The transistor-side terminal of each memory element is connected to a first current line (i.e., as a plate or plate line) for applying a fixed reference potential, (e.g., ground). In addition, the memory-cell-side terminal of each memory element is connected to a second current line (i.e., a bit line) for applying a variable operating voltage. Furthermore, the gate terminal of the selection transistor of each memory element is connected to a third current line for controlling the selection transistor, wherein the third current line may be a word line.

By comparison with conventional NOR architecture, the plate line and bit line are interchanged. To put it another way, according to the described memory arrangement, the diffusion regions of the MOS memory cell selection transistors are connected to the plate line and not to the bit line. An advantage of such an arrangement is that the second current line (bit line) does not have to be led around the contact plugs connecting the MOS memory cell transistors to the memory cells, that is to say that it is not necessary to make any contact holes with an insulation clearance into the second current line (bit line). In other words, since contact holes with insulation clearance are not required to be led through the second current line (bit line); the second current line can be formed with a minimum dimension. Therefore, it is possible to reduce the width of the second current line (bit line) to the width of a contact plug connecting the MOS memory cell transistors to the memory cells. For the circuit layout this means that the second current lines (bit lines) can move closer together, with the result that the line structures overall are led more densely and the area requirement per memory cell is thus reduced. The result is a significantly smaller memory cell area, as compared to the conventional NOR circuit arrangement. In particular, a memory cell area of approximately 6 $F^2$ can be achieved via this NOR circuit arrangement.

Very small memory cell areas can be achieved via a NAND interconnection of the resistive memory cells. In accordance with a second embodiment, a NAND memory arrangement is provided comprising a multiplicity of resistive memory elements connected in series forming chains. The memory elements are each configured such that a resistive memory cell and a MOS memory cell selection transistor are connected in parallel. In other words, the source-drain path of the MOS memory cell selection transistor is connected in parallel with the memory cell, with the result that the latter can be bridged. Each chain can be selected via at least one MOS chain selection transistor. One terminal of a chain of memory elements is connected, if appropriate via a MOS chain selection transistor, to a first current line for applying a fixed reference potential (e.g., ground). The first current line may be identified with the plate or plate line. The other terminal of the chain is connected, if appropriate via a further or sole MOS chain selection transistor, to a second current line for applying a variable operating voltage. The second current line may be identified with a bit line. Furthermore, the gate terminal of each selection transistor is in each case connected to a third current line for the control thereof. The first current line (i.e., plate or plate line) runs on that side of the memory cells of the chain which faces the MOS memory cell transistors of the chain. The second current line (i.e., bit line) runs on that side of the memory cells of the chain which is remote from the memory cell transistors of the chain.

According to the NAND and NOR arrangements described above, the second current line (i.e., bit line) can be embodied with minimum feature width since it is not necessary to make any contact holes with insulation clearance for the contact plugs connecting the MOS memory cell selection transistors to the memory cells. Therefore, the second current lines can be moved closer together in the context of the circuit layout and the memory cell area can be reduced. If, in the NAND arrangement, for example, eight memory cells per chain are connected in series, it is possible to achieve a memory cell area of approximately 5.2 $F^2$, where the STI (Shallow Trench Isolation) trenches are taken into account in the calculation.

Consequently, via the described NOR and NAND arrangement, a memory cell area of less than approximately 9 $F^2$ can be achieved which may lie, for example, within the range of approximately 5-6 $F^2$.

According to the described memory arrangement, the first current line (i.e., plate or plate line) is arranged perpendicular to the second current line (i.e., bit line). Furthermore, the first current line (i.e., plate or plate line) is arranged parallel to the third current line (i.e., word line).

The resistive memory cells of the described NOR and NAND memory arrangements comprise a resistive memory material that can switch between at least two detectable states with different electrical resistances. The resistive memory material may be, for example, a polymer layer with embedded proteins, a phase change material, for example a chalcogenide, or a solid electrolyte material in which metallic precipitates are precipitated. In general, all organic, organometallic and inorganic materials (e.g., copper-containing compounds) which exhibit a reversible switching effect in the above sense are appropriate for the described resistive memory material. Copper-containing compounds are preferred in this case.

Exemplary embodiments of the memory arrangements are now described with reference to the figures.

Figure 4A:
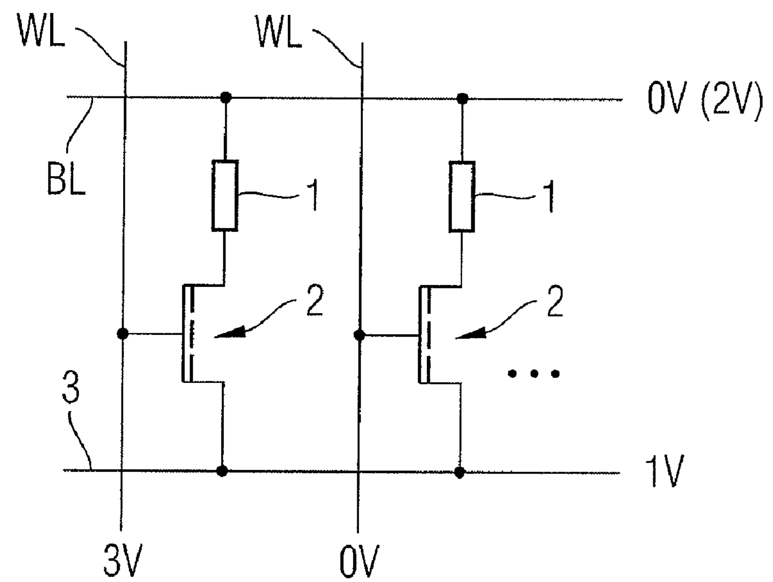
FIGS. 4A and 4B schematically illustrate an exemplary embodiment of a NOR architecture comprising resistive memory cells of a memory arrangement, and also exemplary writing and reading operations.
Figure 4B:
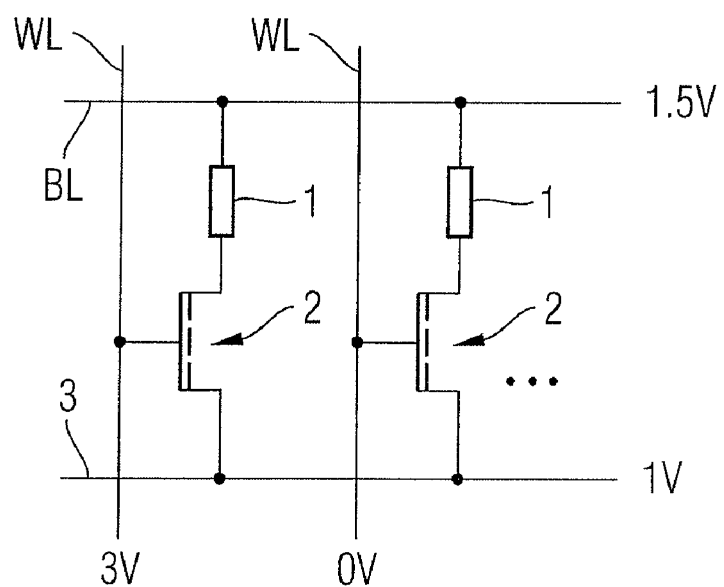

FIGS. 4A and 4B schematically illustrate an exemplary embodiment of a NOR architecture comprising resistive memory cells according to the invention, and also illustrate writing and reading operations in an exemplary manner. Accordingly, the memory elements comprising a resistive memory cell 1 and MOS memory cell selection transistor 2 are in each case connected to a bit line (BL) on the memory cell side and to a plate line 3 on the transistor side, a reference potential being present at the plate line.

FIG. 4A, in particular, shall now be considered, where a writing operation is illustrated by way of example. Accordingly, for the purpose of writing to the resistive memory cell, e.g., a voltage of 0 or 2 V is applied to the bit line BL, while a reference voltage of 1 V is present at the plate line 3, in order to write a logic "1" or "0". FIG. 4B illustrates a reading operation in an exemplary manner. Accordingly, e.g., a voltage of 1.5 V is applied to the bit line BL, while a voltage of 1 V is applied to the plate line 3, with the result that a voltage of 0.5 V is dropped across the resistive memory element. In order to determine the logic state of the memory cell, the current dependent on the resistance of the resistive memory cell is measured.

Figure 5A:
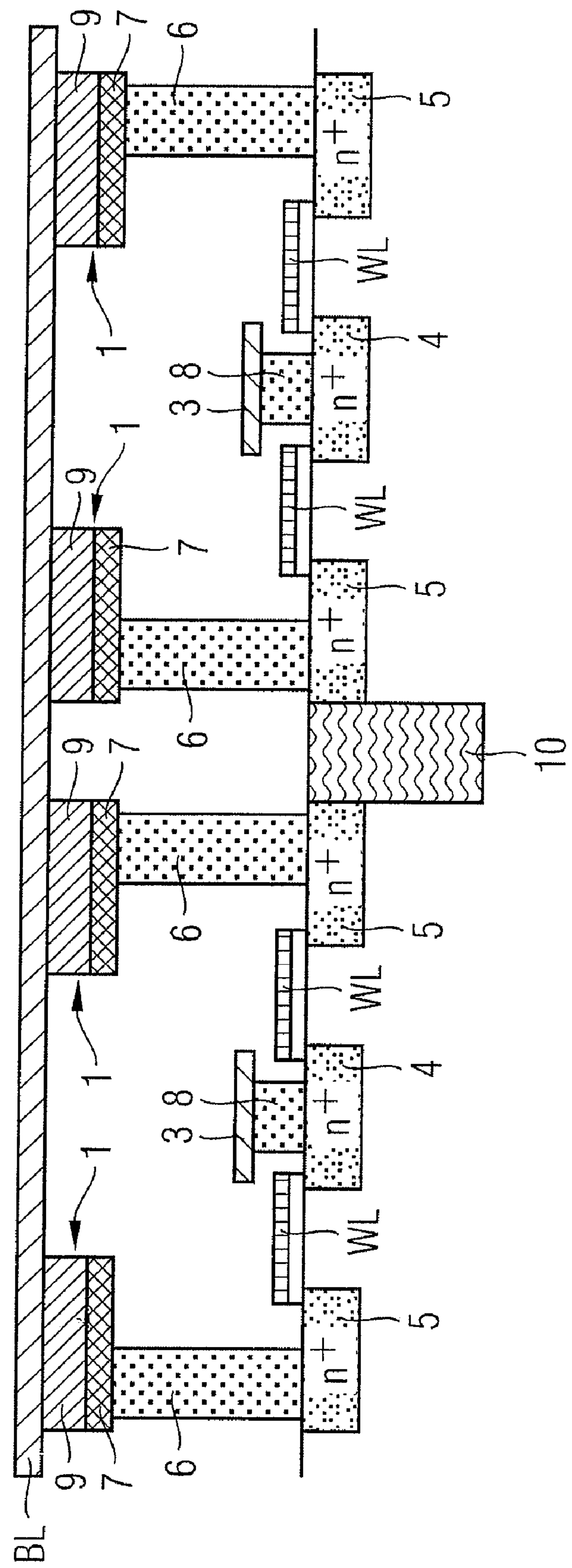
FIGS. 5A and 5B schematically show a sectional illustration and plan view of the NOR architecture comprising resistive memory cells for the memory arrangement of FIGS. 4A and 4B.
Figure 5B:
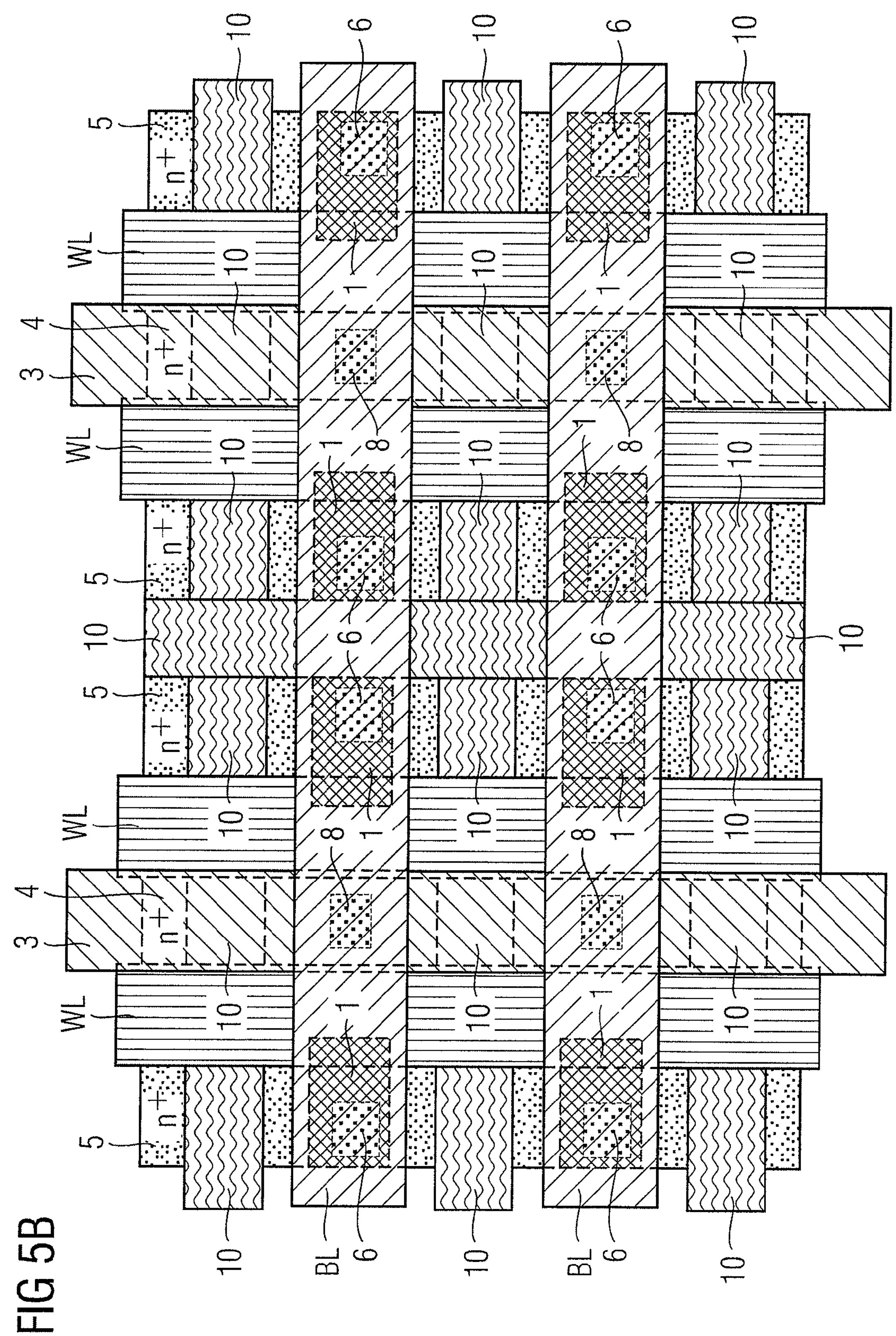

FIGS. 5A and 5B schematically show an exemplary embodiment of the NOR architecture of memory elements according to the invention in a sectional illustration and plan view, respectively. In the exemplary embodiment of the NOR architecture according to the invention that is shown, $n^+$-doped source regions 4 and $n^+$-doped drain regions 5 are formed in the surface of a p-conducting semiconductor body. The drain regions 5 are in each case connected to the bottom electrodes 7 of resistive memory cells 1 via contact plugs 6 composed of polycrystalline silicon, for example, with the result that, in each of the memory cells 1, a resistive memory material 9 is connected to one of the drain regions 5 via the bottom electrode 7 and the contact plug 6. On the other hand, the resistive memory material 9 is connected to a bit line BL. Furthermore, word lines WL for controlling the transistors are in each case arranged in a position disposed opposite channel zones (not specifically shown) situated between the source and drain regions. Each of the source regions 4 is connected to a plate line 3 via contact plugs 8 comprising, for example, polycrystalline silicon. A source region 4 is in each case assigned to a pair of drain regions 5, two adjacent pairs of drain regions 5 being electrically insulated from one another by STI (Shallow Trench Isolation) trenches 10. Furthermore, the structures above the semiconductor body are embedded in a dielectric material (not specifically shown) comprising, for example, $SiO_2$.

As can be seen from FIGS. 5A and 5B, the plate lines 3 extend in a direction parallel to the word lines WL and perpendicular to the bit lines BL. As can be discerned in particular in the plan view of FIG. 5B, a more compact, narrower circuit arrangement is achieved via the arrangement of bit and plate lines according to the invention by comparison with the conventional NOR circuit arrangements, which is reflected in a comparatively smaller memory cell area.

Figure 6A:
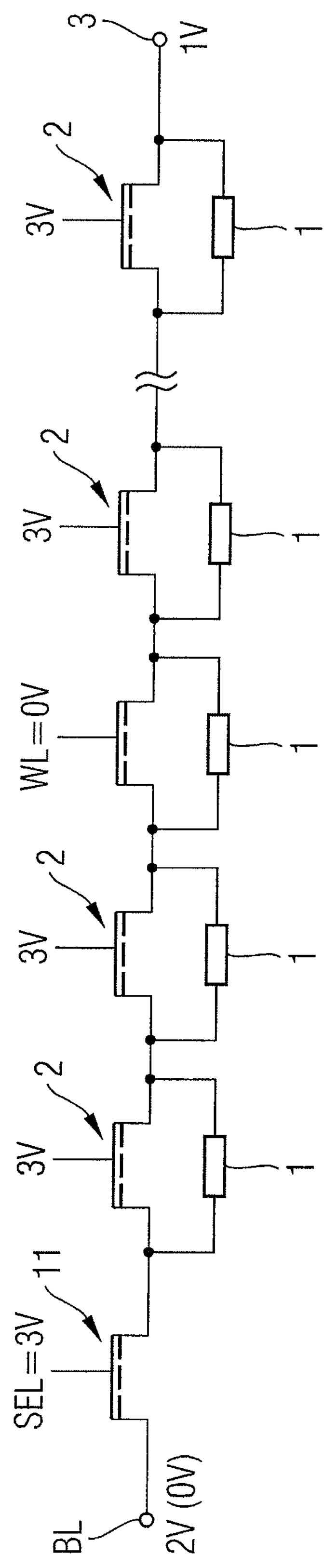
FIGS. 6A and 6B schematically illustrate an exemplary embodiment of a NAND architecture comprising resistive memory cells of a memory arrangement, and also exemplary writing and reading operations.
Figure 6B:
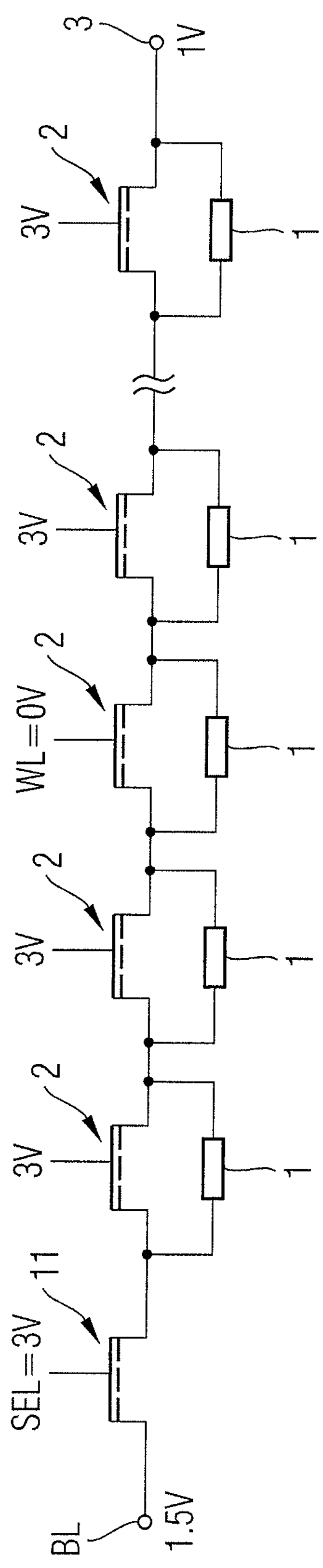

FIGS. 6A and 6B schematically illustrate an exemplary embodiment of the NAND architecture comprising resistive memory cells according to the invention, and also writing and reading operations. Accordingly, the memory elements in each case comprise a resistive memory cell 1 connected in parallel with a MOS memory cell selection transistor 2, with the result that a resistive memory cell 1 can in each case be bridged by a memory cell selection transistor 2. A plurality of memory elements, e.g., eight memory elements are respectively connected in series thereby forming a chain. Each chain of memory elements connected in series is connected, on the one hand, via a MOS chain selection transistor 11 to a bit line BL and, on the other hand, to a plate line 3, to which a reference potential is applied. In this case, the MOS memory cell selection transistors 2 are in each case driven by a word line WL.

A writing operation of the NAND memory arrangement is illustrated by way of example in FIG. 6A. With the exception of the selected MOS memory cell selection transistor 2, at the gate terminal of which a voltage of 0 V is present, a voltage of 3 V is present at all the gate terminals of the MOS memory cell selection transistors 2, with the result that the transistors are in each case switched into the ON state and therefore bridge the associated memory cells 1. Via the select signal SEL, a MOS chain selection transistor 11 is put into the ON state and the respective chain is connected to the bit line BL. In the example shown in FIG. 6A, an SEL signal of 3 V is used. For the purpose of writing a logic "1" or "0" to a memory cell 1 selected via the MOS chain selection transistor 11 and the MOS memory cell selection transistor 2, a voltage of 2 V or 0 V, respectively, is applied to the bit line BL, while a reference voltage of 1 V is present at the plate line 3. The reading operation is illustrated by way of example in FIG. 6B. For this purpose, with chain selection transistor 11 and memory cell selection transistor 2 switched on, a read voltage of 1.5 V is applied to the bit line BL, while a reference voltage of 1 V is applied to the plate line 3, the respective current flowing through the selected memory cell 1 being measured. During writing and reading, a voltage of 1 V is present at all non-activated bit lines, all the chain selection transistors 11 of the non-selected chains are switched off, and all the word lines WL of the non-selected memory cells are at 3 V, with the result that all the non-activated memory cells are short-circuited by their respective memory cell selection transistors 2 and are accordingly independent of disturbances.

Figure 7A:
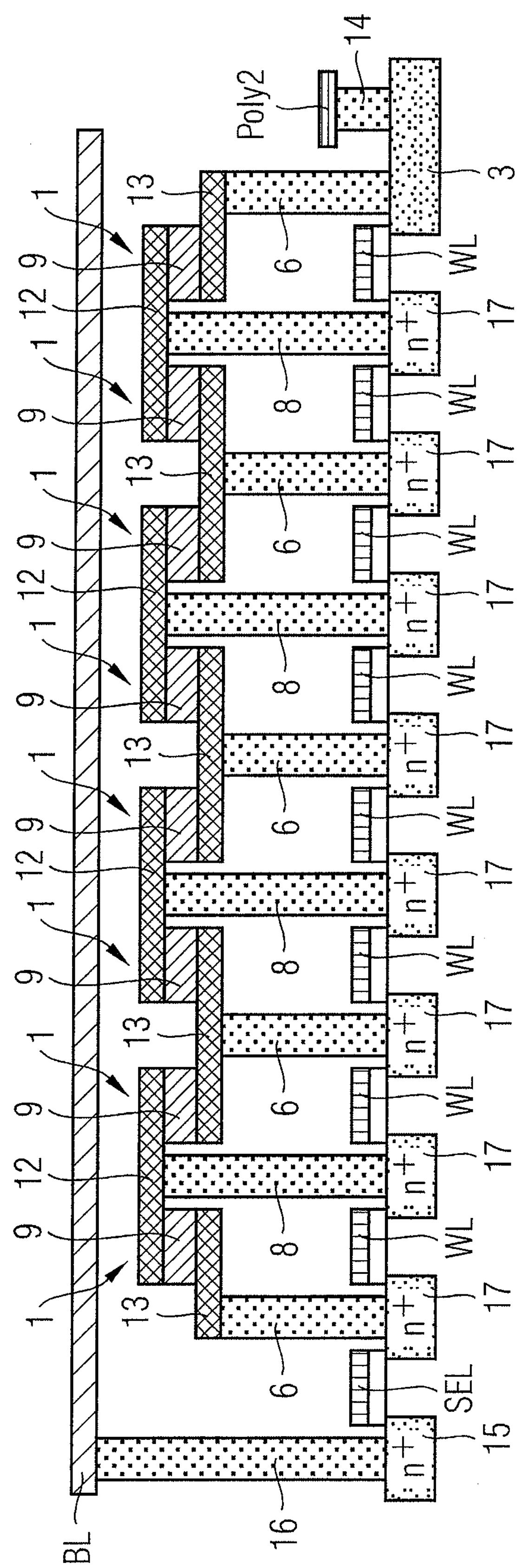
FIGS. 7A and 7B schematically show a sectional illustration and plan view of the NAND architecture comprising resistive memory cells of the memory arrangement of FIGS. 6A and 6B.
Figure 7B:
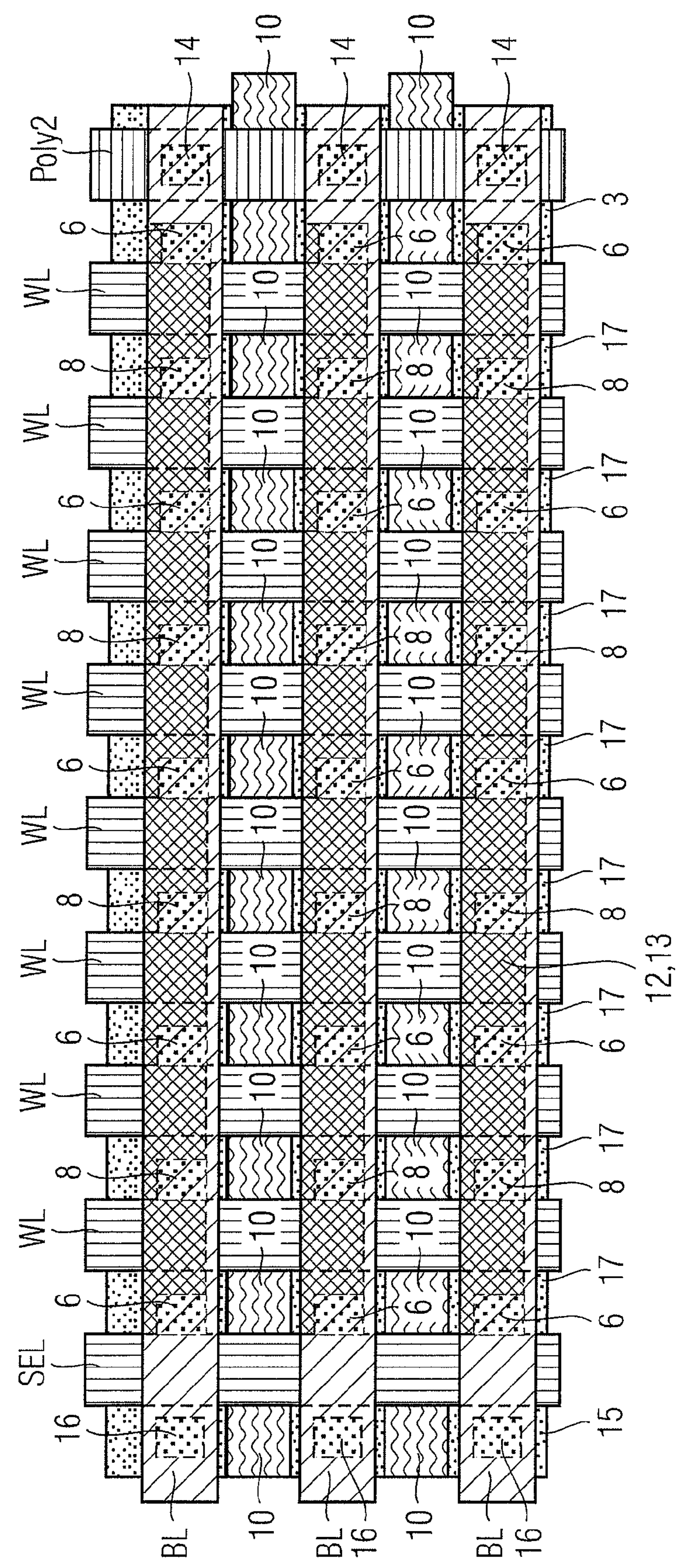

FIGS. 7A and 7B schematically show an exemplary embodiment of the NAND architecture of memory elements according to the invention in a sectional illustration and plan view, respectively. In the exemplary embodiment of the NAND architecture, $n^+$-doped regions 17 are formed in the surface of a p-conducting semiconductor body. Above the $n^+$-doped regions 17, resistive memory cells are connected to one another in pairs in a series interconnection via top electrodes 12 and bottom electrodes 13. The $n^+$-doped regions 17 are alternately connected to the bottom electrodes 13 via contact plugs 6 comprising, for example, polycrystalline silicon and to the top electrodes 12 contact plugs 8, with the result that each resistive memory cell 1 situated between a contact plug 6 and a contact plug 8 can be short-circuited by the associated memory cell selection transistor. Each chain of memory elements is connected to the plate line 3 via a contact plug 6. The plate line 3 is connected to a Poly2 line via a contact plug 14 comprising, for example, polycrystalline silicon. On the other hand, each chain of memory elements is connected to a bit line BL via a chain selection transistor and a, likewise for example, $n^+$-doped diffusion region 15 and also a contact plug 16 comprising, for example, polycrystalline silicon. Word lines WL, for controlling the memory cell selection transistors, are in each case arranged in a position disposed opposite channel zones (not shown) situated between the $n^+$-doped regions 17. In a position disposed opposite the channel zone (not shown) of the chain selection transistor 11, a select line SEL is arranged for the control thereof. In the exemplary embodiment shown, the select line SEL and also the Poly2 line extend in a first direction that is parallel to the word lines WL, while the bit lines BL extend in a second direction that is perpendicular to the word lines WL. Via the NAND memory arrangement according to the described device, a further reduction of the memory cell area can be realized by comparison with the NOR memory arrangement.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A NOR memory arrangement comprising a plurality of resistive memory elements, each memory element comprising:

a resistive memory cell comprising a resistive memory material; and a MOS memory cell selection transistor connected in series, via a source-drain path of the selection transistor, to the resistive memory cell;

wherein each memory element is connected via the source-drain path of the selection transistor to a first current line that applies a reference voltage, each memory element is connected via the resistive memory cell to a second current line that applies an operating voltage, each memory element is connected to a third current line via a gate terminal of the MOS memory cell selection transistor, the first current line is disposed at a location between the second current line and the third current line, the first and third current lines extend in directions that are transverse a direction in which the second current line extends, and at least an isolation layer separates neighboring second current lines.

2. The memory arrangement of claim 1, wherein the first current line extends in a direction parallel to the third current line.

3. The memory arrangement of claim 1, wherein the first current line is grounded.

4. The memory arrangement of claim 1, wherein each memory cell has a memory cell area of less than 9 $F^2$.

5. The memory arrangement of claim 1, wherein each memory cell has a memory cell area within the range of 5 $F^2$ to 6 $F^2$.

6. The memory arrangement of claim 1, wherein the resistive memory material comprises copper.

* * * * *